(12) United States Patent
Li et al.

(10) Patent No.: US 7,671,578 B2
(45) Date of Patent: *Mar. 2, 2010

(54) DETECTION CIRCUIT FOR SENSING THE INPUT VOLTAGE OF TRANSFORMER

(75) Inventors: Chuh-Ching Li, Taoyuan County (TW); Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/456,573

(22) Filed: Jul. 11, 2006

(65) Prior Publication Data

US 2008/0012547 A1 Jan. 17, 2008

(51) Int. Cl.
*G01R 31/02* (2006.01)
*H02M 3/335* (2006.01)

(52) U.S. Cl. .................. 324/72; 363/21.15
(58) Field of Classification Search .......... 324/72, 324/416, 522; 363/21.12, 21.13, 21.15, 21.16, 363/21.18
See application file for complete search history.

(56) References Cited

U.S. PATENT DOCUMENTS

| | | | | |
|---|---|---|---|---|
| 3,701,937 A * | 10/1972 | Combs | ............... | 363/25 |
| 4,630,186 A * | 12/1986 | Kudo | ............... | 363/19 |
| 4,763,235 A * | 8/1988 | Morita | ............... | 363/19 |
| 5,717,578 A * | 2/1998 | Afzal | ............... | 320/111 |
| 5,999,433 A * | 12/1999 | Hua et al. | ............... | 363/132 |
| 6,208,534 B1 * | 3/2001 | Shteynberg et al. | ............... | 363/21.04 |
| 6,324,079 B1 * | 11/2001 | Collmeyer et al. | ............... | 363/21.15 |
| 6,828,803 B2 * | 12/2004 | Ichimasa et al. | ............... | 324/678 |
| 6,836,415 B1 * | 12/2004 | Yang et al. | ............... | 363/21.01 |
| 6,853,563 B1 | 2/2005 | Yang et al. | | |
| 7,016,204 B2 | 3/2006 | Yang et al. | | |
| 7,054,170 B2 * | 5/2006 | Yang et al. | ............... | 363/21.18 |
| 7,075,306 B2 * | 7/2006 | Emori et al. | ............... | 324/430 |
| 7,295,451 B2 * | 11/2007 | Charles | ............... | 363/21.15 |
| 7,362,592 B2 * | 4/2008 | Yang et al. | ............... | 363/21.13 |
| 7,388,764 B2 * | 6/2008 | Huynh et al. | ............... | 363/21.16 |
| 7,397,229 B2 * | 7/2008 | Halberstadt | ............... | 323/284 |
| 2005/0146903 A1 * | 7/2005 | Yang et al. | ............... | 363/21.15 |
| 2006/0044845 A1 * | 3/2006 | Fahlenkamp et al. | ............... | 363/21.15 |
| 2006/0284567 A1 * | 12/2006 | Huynh et al. | ............... | 315/246 |
| 2008/0048633 A1 * | 2/2008 | Li et al. | ............... | 323/299 |

* cited by examiner

*Primary Examiner*—Hoai-An D Nguyen
(74) *Attorney, Agent, or Firm*—Jianq Chyun IP Office

(57) ABSTRACT

A circuit for detecting an input voltage of a transformer is provided. The circuit includes a current source circuit coupled to a winding of a transformer. A current-to-voltage circuit is coupled to the current source circuit to generate a first voltage in response to a current outputted from the current source circuit. A sample-and-hold circuit generates an output voltage by sampling the first voltage. The transformer is coupled to the input voltage, and the output voltage is correlated to the input voltage of the transformer.

6 Claims, 4 Drawing Sheets

DETECTION CIRCUIT FOR SENSING THE INPUT VOLTAGE OF TRANSFORMER

BACKGROUND OF THE INVENTION

1. Field of the Invention

The present invention relates to a power converter, and more specifically relates to a control circuit of switching power converters.

2. Description of Related Art

Various power converters have been widely used to provide regulated voltage and current For the sake of safety reasons, an off-line power converter uses a transformer to isolate its primary side and secondary side. Because the reflected voltage of the transformer can be used for regulations, the controller of the power converter normally includes a voltage-detection terminal coupled to the transformer to detect the reflected voltage of the transformer. hi recent development, many control schemes have been disclosed, such as "Primary-side controlled feedback power converter" by Yang, et al, U.S. Pat. No. 6,853,563; "Close-loop PWM controller for primary-side controlled power converters" by Yang, et al, U.S. Pat. No. 7,016,204; in which the voltage-detection terminal is operated as a feedback input terminal. The object of the present invention is to provide a detection circuit using the voltage-detection terminal to sense the input voltage of transformer. Therefore, no further feedback input terminal is needed.

SUMMARY OF THE INVENTION

The present invention provides a detection circuit to detect an input voltage of a transformer. The detection circuit comprises a current source circuit coupled to a winding of a transformer. A current-to-voltage circuit is coupled to the current source circuit to generate a first voltage in response to the current outputted from the current source circuit. A sample-and-hold circuit generates an output voltage by sampling the first voltage. A pulse generator is coupled to the sample-and-hold circuit to provide a pulse signal in response to the switching of the transformer. The operating of the sample-and-hold circuit provides low pass filtering to the output voltage. The transformer is coupled to an input voltage. The output voltage is therefore correlated to the input voltage of the transformer.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

DESCRIPTION OF THE PREFERRED EMBODIMENTS

Figure 1:
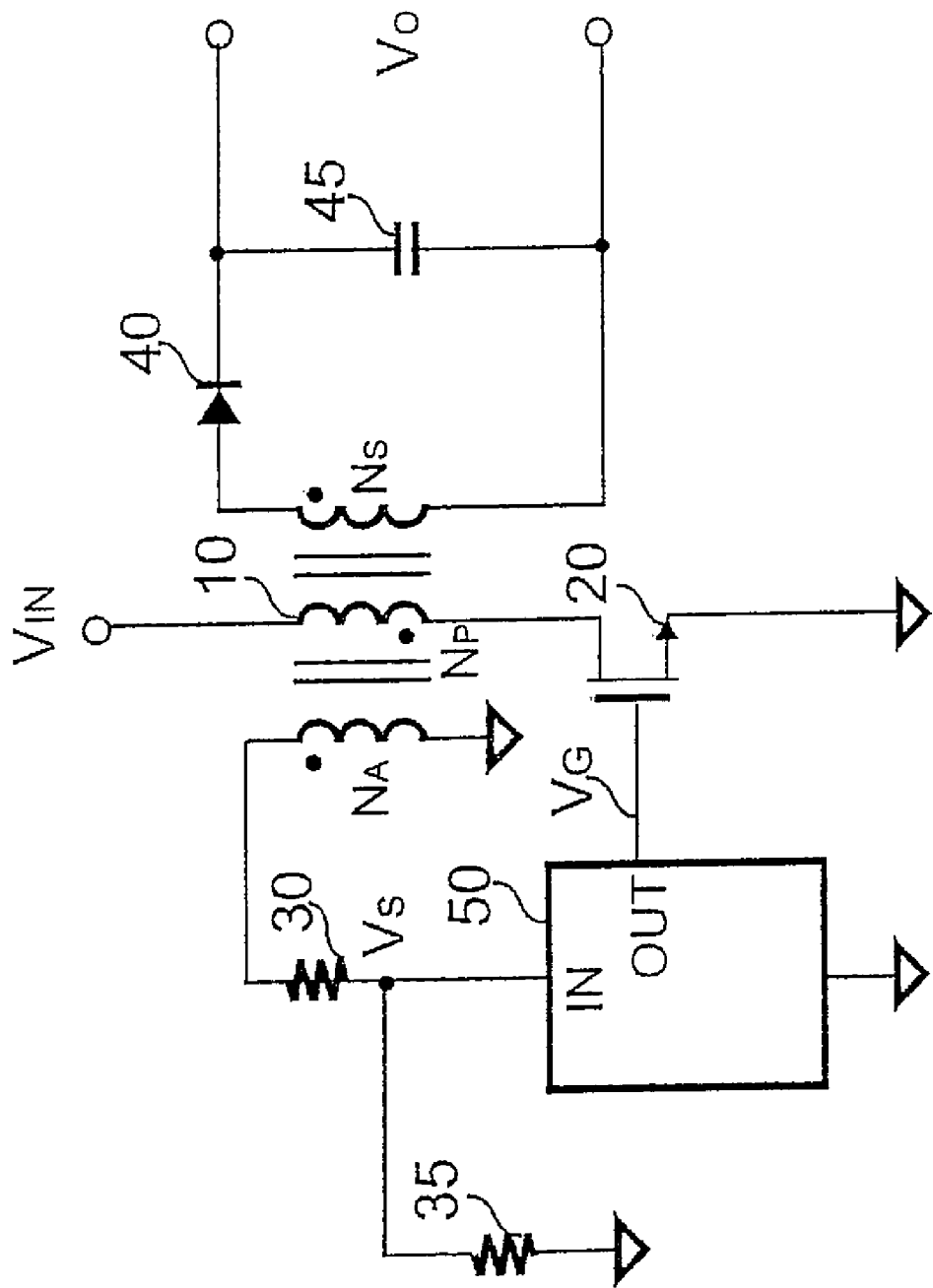
FIG. 1 shows a schematic diagram of a power converter having a voltage-detection terminal coupled to a transformer.
Figure 2:
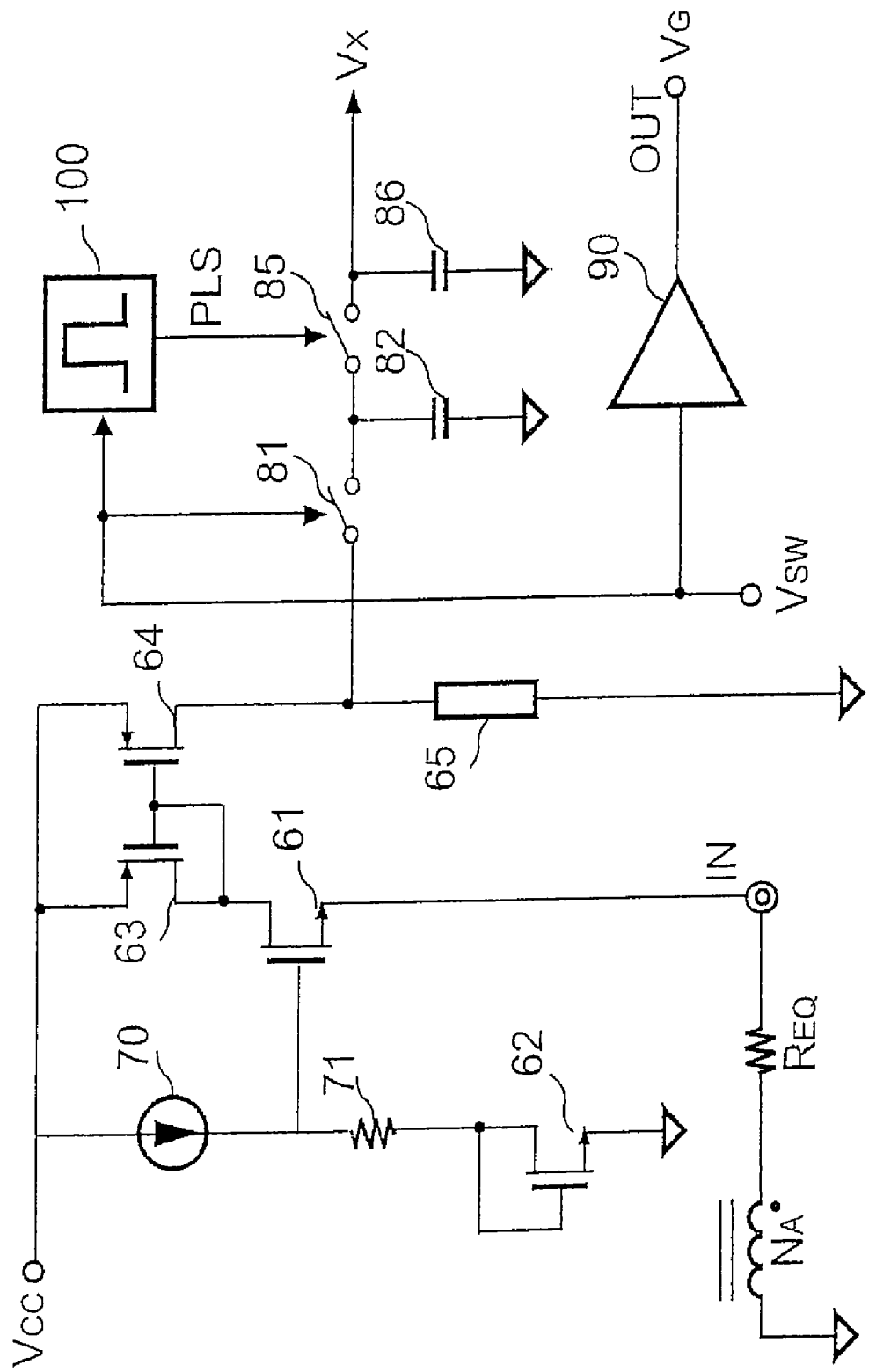
FIG. 2 is a detection circuit according to an embodiment of the present invention.

FIG. 1 shows a power converter. A transformer 10 includes a primary winding $N_P$, a secondary winding $N_S$ and an auxiliary winding $N_A$. The secondary winding $N_S$ is coupled to the output $V_O$ of the power converter through a rectifier 40 and a capacitor 45. The primary winding $N_P$ of the transformer 10 is connected from an input voltage $V_{IN}$ to a transistor 20. The transistor 20 is used for switching the transformer 10 and regulating the output $V_O$ of the power converter. The power converter has a control circuit 50 including a voltage-detection terminal IN coupled to the auxiliary winding $N_A$ of the transformer 10 through a voltage divider. Resistors 30 and 35 form the voltage divider. FIG. 2 shows a detection circuit of the control circuit 50. The detection circuit comprises a first circuit coupled to the voltage-detection terminal IN. The first circuit is a current source circuit formed by a transistor 61. A bias circuit is coupled to the first circuit to provide a bias voltage to the gate of the transistor 61. A constant current source 70, a resistor 71 and a transistor 62 form the bias circuit to generate the bias voltage. During the switching of the transformer 10, the voltage of the voltage-detection terminal IN will be clamped to a voltage $V_S$ when the voltage produced at the voltage-detection terminal IN would be lower than the voltage $V_S$. The voltage $V_S$ is determined by the current of the constant current source 70 and the resistance of the resistor 71. A current outputted from the first circuit can be expressed as $I_S$, $$I_S = \frac{V_S - \left(-\frac{T_{NA}}{T_{NP}} \times V_{IN} \times K\right)}{R_{EQ}} \quad (1)$$

where the $T_{NA}$ and $T_{NP}$ are winding turns of the auxiliary winding $N_A$ and the primary winding $N_P$ respectively; K is the ratio of the divider (resistors 30 and 35); $R_{EQ}$ is the equivalent resistance of resistors 30 and 35; $V_{IN}$ is the input voltage of the transformer 10.

A second circuit is coupled to the first circuit to generate an output voltage $V_X$ in response to the current $I_S$. The second circuit includes a current-to-voltage circuit and a sample-and-hold circuit. The current-to-voltage circuit is connected to the first circuit to generate a first voltage in response to the current outputted from the first circuit. The sample-and-hold circuit further generates the output voltage $V_X$ by sampling the first voltage. Transistors 63, 64 and a resistive device 65 form the current-to-voltage circuit. The transistor 63 is coupled to receive the current of the transistor 61. The transistor 64 mirrors a current from the transistor 63 to the resistive device 65. The first voltage is generated at the resistive device 65. The sample-and-bold circuit includes switches 81, 85 and capacitors 82, 86. The switch 81 is connected to the resistive device 65 to sample the first voltage to the capacitor 82. The switch 85 is connected to the capacitor 82 to sample the signal from the capacitor 82 to the capacitor 86. The capacitance of the capacitor 86 is larger than the capacitance of the capacitor 82. Therefore, the switching operation of the switch 85 and capacitor 86 forms a low pass filter. The output voltage $V_X$ is generated at the capacitor 86. Because the transformer 10 is coupled to the input voltage $V_{IN}$, the output voltage $V_X$ is therefore correlated to the input voltage $V_{IN}$ of the transformer 10. The output voltage $V_x$ can be expressed by the following equations (2) and (3):

$$V_X = I_S \times G \times R_{65} \times \frac{1}{1 + \frac{j\omega}{j\omega_0}} \quad (2)$$

-continued $$V_X = \frac{V_S + \left(\frac{T_{NA}}{T_{NP}} \times V_{IN} \times K\right)}{R_{EQ}} \times G \times R_{65} \times \frac{1}{1 + \frac{j\omega}{j\omega_0}} \quad (3)$$

where G is a gain determined by the geometrical ratio of transistors 63 and 64; $R_{65}$ is the resistance of the device 65; $\omega_0$ is a dominant pole of die low pass filter.

Figure 3:
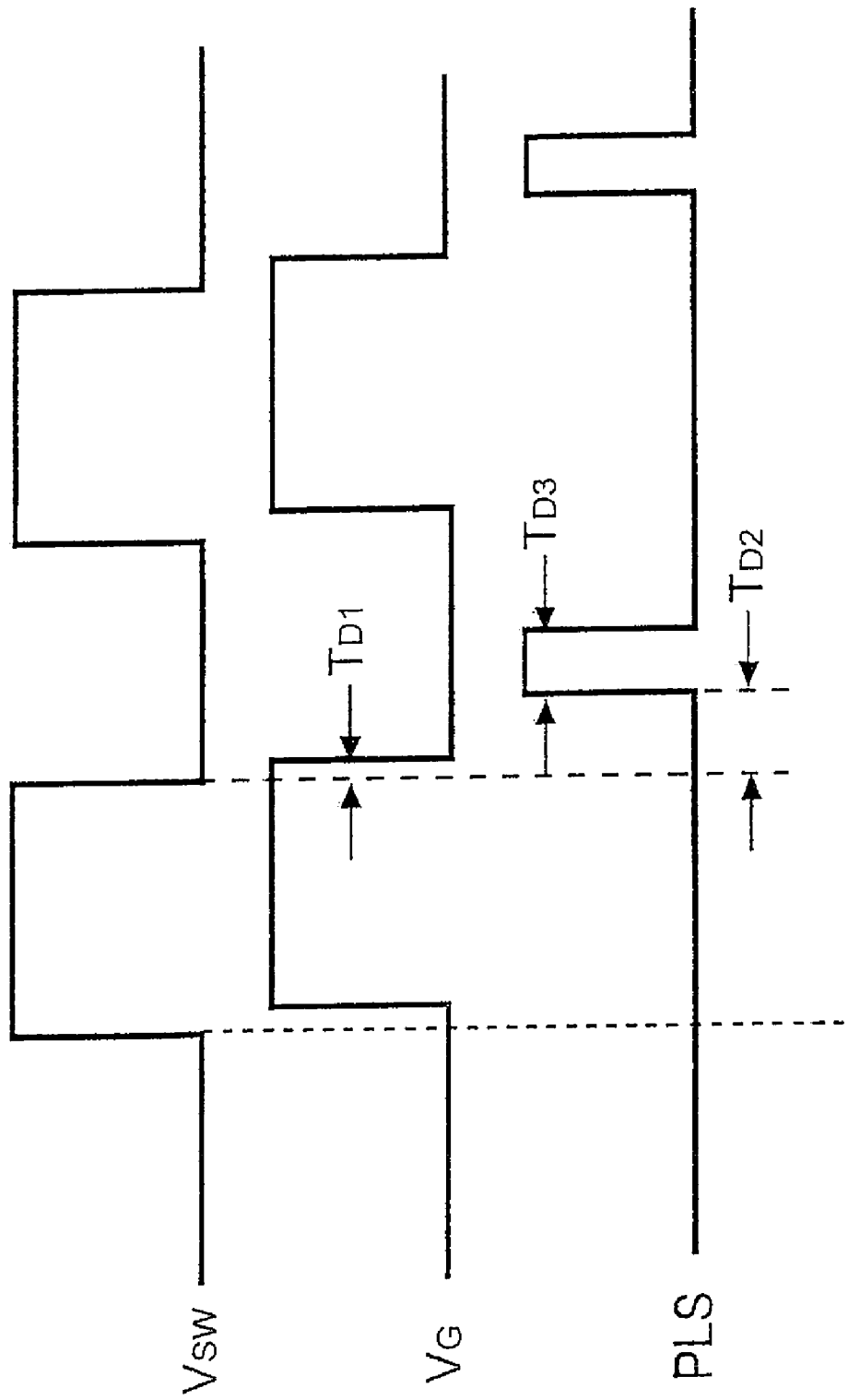
FIG. 3 shows signal-waveforms of the detection circuit according to an embodiment of the present invention.

A switching circuit generates a switching signal $V_{SW}$ to regulate the power converter. The switching signal $V_{SW}$ is used for generating a drive signal $V_G$ through an output buffer 90 to control the transistor 20 as shown in FIG. 1. The switching signal $V_{SW}$ is further coupled to control the on/off of the switch 81. Therefore, the sampling of the first voltage performed within the transistor 20 is turned on. A pulse generator 100 is utilized to generate a pulse signal PLS in accordance with the falling edge of the switching signal $V_{SW}$. The pulse signal PLS is connected to control the sampling of the switch 85. Then the sampling of the switch 85 is performed after the sampling of the switch 81. FIG. 3 shows signal-waveforms of the switching signal $V_{SW}$, the drive signal $V_G$ and the pulse signal PLS. The output buffer 90 causes a propagation delay $T_{D1}$. Another delay time $T_{D2}$ and a pulse width $T_{D3}$ of the pulse signal PLS are generated by the pulse generator 100.

Figure 4:
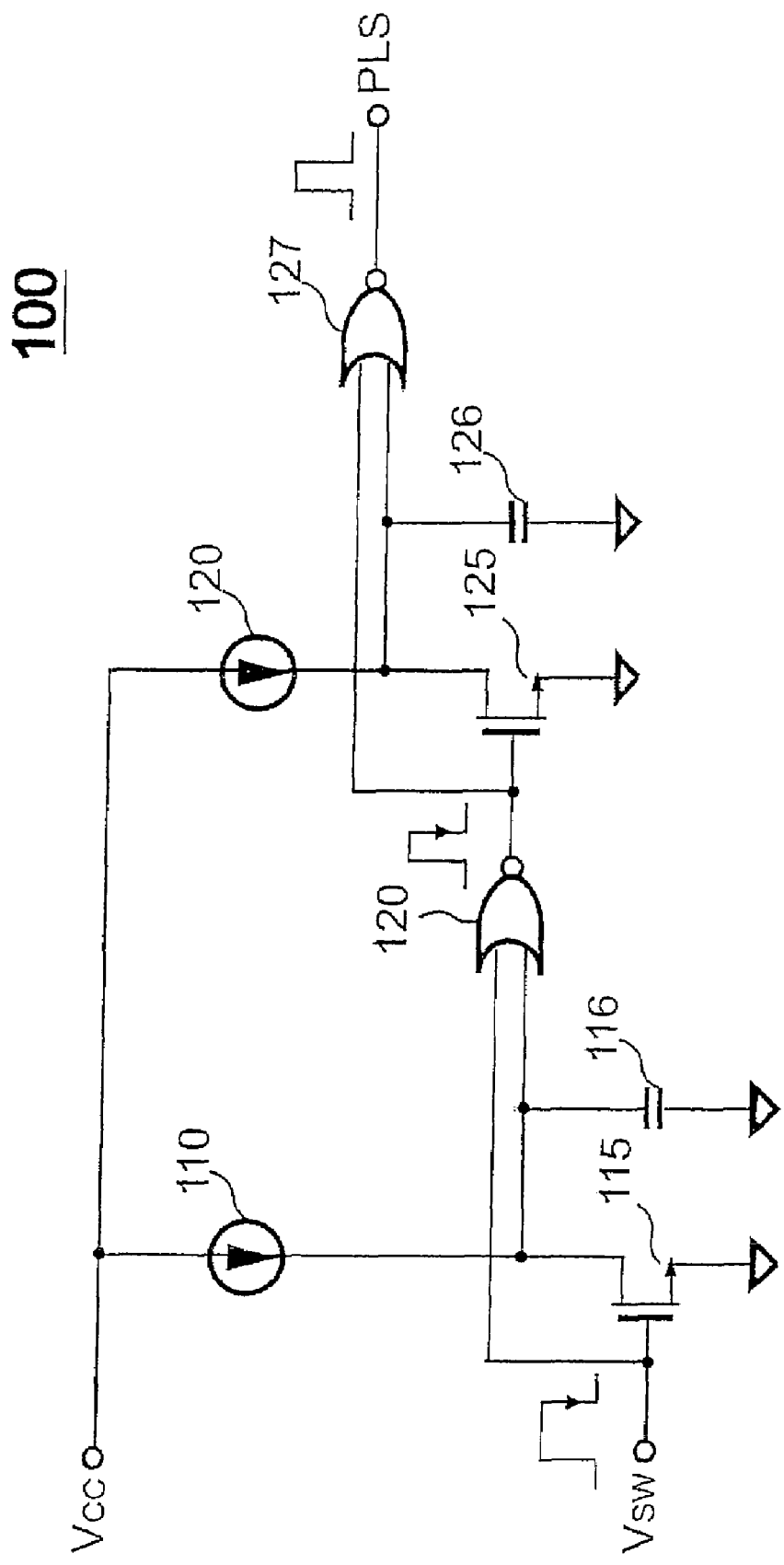
FIG. 4 shows the schematic diagram of a pulse generator.

FIG. 4 shows the schematic diagram of the pulse generator 100. A constant current-source 110, a transistor 115, a capacitor 116 and an NOR gate 117 form a first pulse generator and produces a first pulse signal in response to the falling edge of the switching signal $V_{SW}$. A constant current-source 120, a transistor 125, a capacitor 126 and an NOR gate 127 form a second pulse generator and produces the pulse signal PLS in response to the falling edge of the first pulse signal. The current of the constant current-source 110 and the capacitance of the capacitor 116 determine the pulse width of the first pulse signal. The pulse width of the first pulse signal produces the delay time $T_{D2}$. The current of the constant current-source 120 and the capacitance of the capacitor 126 determine the pulse width $T_{D3}$ of the pulse signal PLS.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A detection circuit for detecting an input voltage, comprising:
    a current source circuit receiving a bias voltage and being coupled to an auxiliary winding of a transformer;
    a current-to-voltage circuit, directly connected to the current source circuit to generate a first voltage in response to a current outputted from the current source circuit; and
    a sample-and-hold circuit, generating an output voltage by sampling the first voltage,
    wherein the transformer is coupled to an input voltage, the output voltage is correlated to the input voltage of the transformer, and the bias voltage is independent from the output voltage.

2. The detection circuit as claimed in claim 1, further comprising a pulse generator coupled to the sample-and-hold circuit to provide a pulse signal for the sample-and-hold circuit in response to a switching of the transformer.

3. The detection circuit as claimed in claim 1, further comprising a bias circuit coupled to the current source circuit to provide the bias voltage to the current source circuit.

4. The-detection circuit as claimed in claim 1, wherein the current source circuit is coupled to the auxiliary winding of the transformer through a resistor.

5. The detection circuit as claimed in claim 1, wherein the sample-and-hold circuit comprises a first capacitor to sample the first voltage.

6. A detection circuit, comprising:
    a current source circuit, coupled to a winding of a transformer;
    a current-to-voltage circuit, coupled to the current source circuit to generate a first voltage in response to a current outputted from the current source circuit; and
    a sample-and-hold circuit, comprising a first capacitor to sample the first voltage, a second capacitor to sample a signal from the first capacitor, and the capacitance of the second capacitor is larger than that of the first capacitor, generating an output voltage by sampling the first voltage, wherein the transformer is coupled to an input voltage, and the output voltage is correlated to the input voltage of the transformer.

* * * * *